United States Patent
Suzuki et al.

(10) Patent No.: US 12,319,996 B2
(45) Date of Patent: Jun. 3, 2025

(54) CUTTING TOOL

(71) Applicant: Sumitomo Electric Hardmetal Corp., Itami (JP)

(72) Inventors: Yuta Suzuki, Itami (JP); Kosuke Fukae, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 18/033,564

(22) PCT Filed: Feb. 17, 2021

(86) PCT No.: PCT/JP2021/005902
§ 371 (c)(1),
(2) Date: Apr. 25, 2023

(87) PCT Pub. No.: WO2022/176057
PCT Pub. Date: Aug. 25, 2022

(65) Prior Publication Data
US 2023/0398607 A1    Dec. 14, 2023

(51) Int. Cl.
*C23C 14/10* (2006.01)
*C04B 41/50* (2006.01)
(Continued)

(52) U.S. Cl.
CPC ...... *C23C 14/0641* (2013.01); *C04B 41/5063* (2013.01); *C04B 41/5068* (2013.01);
(Continued)

(58) Field of Classification Search
CPC ............ B23B 2224/08; B23B 2224/24; B23B 2224/32; B23B 2224/36; C23C 14/0658;
(Continued)

(56) References Cited

U.S. PATENT DOCUMENTS 5,318,840 A * 6/1994 Ikeda ...................... C23C 14/06
51/307
2007/0259202 A1* 11/2007 Ogami .................. C23C 14/024
204/192.16
(Continued)

FOREIGN PATENT DOCUMENTS

CN    111270202 A  *  6/2020  ......... C23C 14/0021
JP    2007-30130 A     2/2007
(Continued)

OTHER PUBLICATIONS

Machine translation of CN 111270202 A.*
(Continued)

*Primary Examiner* — Z. Jim Yang
(74) *Attorney, Agent, or Firm* — XSENSUS LLP

(57) ABSTRACT

A cutting tool includes a substrate and a hard layer, wherein the hard layer includes a first unit layer and a second unit layer being alternately layered in the hard layer, a thickness of the first unit layer is 2 to 100 nm, a thickness of the second unit layer is 2 to 100 nm, the first unit layer is composed of $Ti_aAl_bB_cN$, the second unit layer is composed $Ti_dAl_eB_fN$, an atomic ratio a satisfy $0.25 \leq a < 0.45$, an atomic ratio b satisfy $0.55 \leq b < 0.75$, an atomic ratio c satisfy $0 < c \leq 0.1$, a total of the atomic ratios a, b and c is 1, an atomic ratio d satisfy $0.35 \leq d < 0.55$, an atomic ratio e satisfy $0.45 \leq e < 0.65$, an atomic ratio f satisfy $0 < f \leq 0.1$, a total of the atomic ratios d, e and f is 1, the atomic ratios a and d satisfy $0.05 \leq d-a \leq 0.2$, and the atomic ratios b and e satisfy $0.05 \leq b-e \leq 0.2$.

13 Claims, 3 Drawing Sheets

(51) Int. Cl.
*C04B 41/52* (2006.01)
*C23C 14/02* (2006.01)
*C23C 14/06* (2006.01)
*C23C 14/32* (2006.01)
*C23C 30/00* (2006.01)
*B23B 27/14* (2006.01)

(52) U.S. Cl.
CPC ............ *C04B 41/524* (2013.01); *C23C 14/02* (2013.01); *C23C 14/0647* (2013.01); *C23C 14/325* (2013.01); *C23C 30/005* (2013.01); *B23B 27/148* (2013.01); *B23B 2224/32* (2013.01); *B23B 2228/105* (2013.01)

(58) Field of Classification Search
CPC ............ C23C 14/0664; C23C 14/0641; C23C 14/0647; C23C 16/34; C23C 16/342; C23C 16/347; C23C 16/36; C23C 30/005; C23C 28/04–44; C04B 41/5062; C04B 41/5063; C04B 41/5064; C04B 41/5068; C04B 41/52; C04B 41/524; C04B 41/526
See application file for complete search history.

(56) References Cited

U.S. PATENT DOCUMENTS

| | | | |
|---|---|---|---|
| 2009/0317659 A1* | 12/2009 | Yamamoto ............ | C23C 14/325 428/655 |
| 2012/0201615 A1* | 8/2012 | Ni ........................ | C23C 14/0641 407/30 |
| 2014/0272391 A1* | 9/2014 | Kumar ................... | C23C 28/42 428/457 |
| 2015/0152561 A1* | 6/2015 | Kang ..................... | C23C 28/027 428/698 |
| 2015/0217378 A1* | 8/2015 | Tatsuoka ................ | C23C 28/42 428/697 |
| 2015/0360311 A1* | 12/2015 | Zheng .................... | C22C 29/14 228/122.1 |
| 2017/0298505 A1* | 10/2017 | Tatsuoka ................ | C23C 16/34 |
| 2018/0099335 A1* | 4/2018 | Takeshita .............. | C23C 28/044 |
| 2018/0117680 A1 | 5/2018 | Tanaka | |
| 2018/0119271 A1* | 5/2018 | Oden ..................... | C23C 14/0641 |
| 2018/0245201 A1* | 8/2018 | Park ....................... | C23C 14/548 |
| 2018/0281078 A1* | 10/2018 | Hirano ..................... | C04B 41/52 |
| 2018/0347027 A1* | 12/2018 | Kumar ................... | B23B 27/148 |
| 2020/0198017 A1* | 6/2020 | Sasaki .................... | B23D 43/00 |
| 2020/0370173 A1* | 11/2020 | Kido ....................... | C23C 28/044 |
| 2021/0046561 A1 | 2/2021 | Tanaka et al. | |
| 2021/0071291 A1* | 3/2021 | Fallqvist ................ | C23C 14/325 |
| 2021/0108306 A1* | 4/2021 | Kurapov .............. | C23C 14/0641 |
| 2022/0055116 A1* | 2/2022 | Cha ........................ | C23C 14/325 |
| 2022/0297196 A1* | 9/2022 | Josefsson ............... | C23C 28/40 |
| 2022/0297197 A1* | 9/2022 | Johnson ................. | C23C 28/42 |
| 2022/0371099 A1* | 11/2022 | Dobashi .............. | C23C 14/0617 |

FOREIGN PATENT DOCUMENTS

| | | | | |
|---|---|---|---|---|
| JP | 2007-38378 A | | 2/2007 | |
| JP | 2011-224715 A | | 11/2011 | |
| JP | 2011-224717 A | | 11/2011 | |
| JP | 2015066644 A | * | 4/2015 | |
| JP | 2015157351 A | * | 9/2015 | |
| JP | 2017-193004 A | | 10/2017 | |
| JP | 2019-5867 A | | 1/2019 | |
| WO | WO-2013002385 A1 | * | 1/2013 | ......... C23C 14/0641 |
| WO | 2017/169498 A1 | | 10/2017 | |
| WO | 2019/035220 A1 | | 2/2019 | |
| WO | 2020/213264 A1 | | 10/2020 | |

OTHER PUBLICATIONS

Machine translation of JP 2015/066644 A.*
Machine translation of JP 2015/157351 A.*
Office Action issued on Jun. 23, 2023, in corresponding U.S. Appl. No. 17/799,266, 36 pages.
Office Action issued on Nov. 21, 2023, in corresponding U.S. Appl. No. 17/799,266, 33 pages.
Yin-Yu Chang, et al., "Mechanical property and tribological performance of AlTiSiN and AlTiBN hard coatings using ternary alloy targets", Surface & Coatings Technology, vol. 374, Feb. 1, 2018, 8 pages, XP085792358.
Advisory Action mailed Feb. 15, 2024, issued in U.S. Appl. No. 17/799,266, 6 pages.

* cited by examiner

CUTTING TOOL

CROSS-REFERENCE TO RELATED APPLICATION

The present application is based on PCT filing PCT/JP2021/005902, filed Feb. 17, 2021, the entire contents of which are incorporated herein by reference.

TECHNICAL FIELD

The present disclosure relates to a cutting tool.

BACKGROUND ART

Conventionally, a cutting tool in which a substrate is coated with a coating film has been used. For example, Japanese Patent Laying-Open No. 2011-224715 (PTL 1) discloses a surface-coated cutting tool in which a hard coating film layer composed of a composite nitride of Al and Ti and having a layer thickness of 0.8 to 5.0 μm is formed by vapor deposition on a surface of a tool substrate composed of a tungsten carbide-based cemented carbide or titanium carbonitride-based cermet, wherein the hard coating film layer is formed as an alternating layered structure of a thin layer A composed of a granular crystal structure of the composite nitride of Al and Ti and a thin layer B composed of a columnar crystal structure thereof, thin layer A and thin layer B each have a layer thickness of 0.05 to 2 μm, an average crystal grain size of granular crystals in thin layer A is 30 nm or less, and an average crystal grain size of columnar crystals in thin layer B is 50 to 500 nm.

Japanese Patent Laying-Open No. 2017-193004 (PTL 2) discloses a surface-coated cutting tool including a substrate and a coating film formed on a surface of the substrate, wherein the coating film includes an alternating layer, the alternating layer includes a first layer having a first composition and a second layer having a second composition, one or a plurality of the first layers and one or a plurality of the second layers are alternately layered to form the alternating layer, a thickness of each of the one or plurality of first layers and the one or plurality of second layers is 2 nm or more and 100 nm or less, the first composition is represented by $Ti_aAl_bSi_cN$ ($0.25 \le a \le 0.45$, $0.55 \le b \le 0.75$, $0 \le c \le 0.1$, $a+b+c=1$), the second composition is represented by $Ti_dAl_eSi_fN$ ($0.35 \le d \le 0.55$, $0.45 \le e \le 0.65$, $0 \le f \le 0.1$, $d+e+f=1$), and the first composition and the second composition satisfy $0.05 \le d-a \le 0.2$ and $0.05 \le b-e \le 0.2$.

CITATION LIST

Patent Literature

PTL 1: Japanese Patent Laying-Open No. 2011-224715
PTL 2: Japanese Patent Laying-Open No. 2017-193004

SUMMARY OF INVENTION

A cutting tool according to the present disclosure includes a substrate and a hard layer provided on the substrate, wherein
the hard layer includes a first unit layer and a second unit layer,
one or a plurality of the first unit layers and one or a plurality of the second unit layers are alternately layered in the hard layer,
a thickness of each of the one or plurality of first unit layers is 2 nm or more and 100 nm or less,
a thickness of each of the one or plurality of second unit layers is 2 nm or more and 100 nm or less,
the first unit layer is composed of a compound represented by $Ti_aAl_bB_cN$,
the second unit layer is composed of a compound represented by $Ti_dAl_eB_fN$,
an atomic ratio a of a titanium element in the $Ti_aAl_bB_cN$ is 0.25 or more and less than 0.45,
an atomic ratio b of an aluminum element in the $Ti_aAl_bB_cN$ is 0.55 or more and less than 0.75,
an atomic ratio c of a boron element in the $Ti_aAl_bB_cN$ is more than 0 and 0.1 or less,
a total of the atomic ratio a, the atomic ratio b, and the atomic ratio c is 1,
an atomic ratio d of a titanium element in the $Ti_dAl_eB_fN$ is 0.35 or more and less than 0.55,
an atomic ratio e of an aluminum element in the $Ti_dAl_eB_fN$ is 0.45 or more and less than 0.65,
an atomic ratio f of a boron element in the $Ti_dAl_eB_fN$ is more than 0 and 0.1 or less,
a total of the atomic ratio d, the atomic ratio e, and the atomic ratio f is 1,
the atomic ratio a and the atomic ratio d satisfy $0.05 \le d-a \le 0.2$, and
the atomic ratio b and the atomic ratio e satisfy $0.05 \le b-e \le 0.2$.

DETAILED DESCRIPTION

Figure 1:
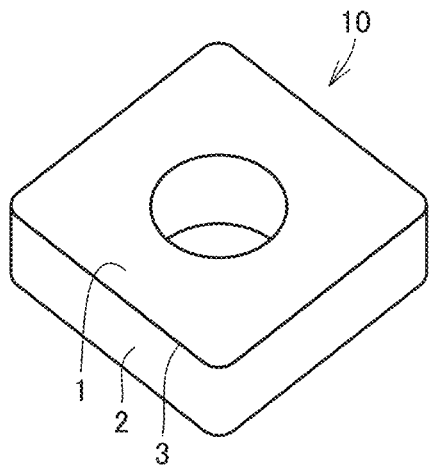
FIG. 1 is a perspective view illustrating one implementation of a cutting tool.

Problems to be Solved by the Present Disclosure

In the surface-coated cutting tool described in PTL 1, since the hard coating film having the above-described configuration is included, wear resistance is expected to be improved to result in a long life of the cutting tool. In the surface-coated cutting tool described in PTL 2, since the coating film having the above-described configuration is included, delamination and crack propagation are expected to be suppressed to result in a long life of the cutting tool. In recent years, however, cutting processes have been performed at a higher speed with higher efficiency and loads applied to cutting tools have been increased, with the result that the life of each of the cutting tools tends to become short. Therefore, it has been required to further improve mechanical characteristics (for example, wear resistance, breakage resistance, heat resistance, and the like) of a coating film of a cutting tool.

The present disclosure has been made in view of the above-described circumstance, and has an object to provide a cutting tool having excellent breakage resistance.

Advantageous Effect of the Present Disclosure

According to the description above, there can be provided a cutting tool having excellent breakage resistance.

DESCRIPTION OF EMBODIMENTS OF THE PRESENT DISCLOSURE

First, embodiments of the present disclosure will be listed and described.

[1] A cutting tool according to the present disclosure includes a substrate and a hard layer provided on the substrate, wherein
the hard layer includes a first unit layer and a second unit layer,
one or a plurality of the first unit layers and one or a plurality of the second unit layers are alternately layered in the hard layer,
a thickness of each of the one or plurality of first unit layers is 2 nm or more and 100 nm or less,
a thickness of each of the one or plurality of second unit layers is 2 nm or more and 100 nm or less,
the first unit layer is composed of a compound represented by $Ti_aAl_bB_cN$,
the second unit layer is composed of a compound represented by $Ti_dAl_eB_fN$,
an atomic ratio a of a titanium element in the $Ti_aAl_bB_cN$ is 0.25 or more and less than 0.45,
an atomic ratio b of an aluminum element in the $Ti_aAl_bB_cN$ is 0.55 or more and less than 0.75,
an atomic ratio c of a boron element in the $Ti_aAl_bB_cN$ is more than 0 and 0.1 or less,
a total of the atomic ratio a, the atomic ratio b, and the atomic ratio c is 1,
an atomic ratio d of a titanium element in the $Ti_dAl_eB_fN$ is 0.35 or more and less than 0.55,
an atomic ratio e of an aluminum element in the $Ti_dAl_eB_fN$ is 0.45 or more and less than 0.65,
an atomic ratio f of a boron element in the $Ti_dAl_eB_fN$ is more than 0 and 0.1 or less,
a total of the atomic ratio d, the atomic ratio e, and the atomic ratio f is 1,
the atomic ratio a and the atomic ratio d satisfy $0.05 \leq d-a \leq 0.2$, and
the atomic ratio b and the atomic ratio e satisfy $0.05 \leq b-e \leq 0.2$.

Since the atomic ratios of the boron elements in the first and second unit layers of the hard layer in the cutting tool are in the above-described ranges, the cutting tool has excellent breakage resistance. That is, since the cutting tool includes the above-described configuration, the cutting tool can have excellent breakage resistance. Further, since the atomic ratios of the aluminum elements in the first and second unit layers of the hard layer are in the above-mentioned ranges, the cutting tool has excellent heat resistance. Here, the term "breakage resistance" means resistance to chipping of a cutting tool during cutting. The term "heat resistance" means resistance to wear, deformation, or the like of a cutting tool in a high-temperature environment.

[2] Preferably, a ratio $I_{(200)}/I_{(002)}$ of an intensity $I_{(200)}$ of an X-ray diffraction peak of a (200) plane to an intensity $I_{(002)}$ of an X-ray diffraction peak of a (002) plane in the hard layer is 2 or more, and
a half-value width of the X-ray diffraction peak of the (002) plane is 2° or more. By defining in this way, the cutting tool can have further excellent breakage resistance. Further, the cutting tool can have further excellent heat resistance.

[3] Preferably, a hardness H of the hard layer at a room temperature is 30 GPa or more. By defining in this way, the cutting tool can have excellent wear resistance in addition to excellent breakage resistance. Here, the term "wear resistance" means resistance to wear of a cutting tool during cutting.

[4] Preferably, a ratio H/E of the hardness H of the hard layer to a Young's modulus E of the hard layer at the room temperature is 0.07 or more. By defining in this way, the cutting tool can have further excellent breakage resistance.

[5] Preferably, a thickness of the hard layer is 1 μm or more and 20 μm or less. By defining in this way, the cutting tool can have excellent wear resistance in addition to excellent breakage resistance.

DETAILS OF EMBODIMENTS OF THE PRESENT DISCLOSURE

The following describes one embodiment (hereinafter, referred to as "the present embodiment") of the present disclosure. However, the present embodiment is not limited thereto. In the present specification, the expression "A to Z" represents a range of lower to upper limits (i.e., A or more and Z or less). When no unit is indicated for A and a unit is indicated only for Z, the unit of A is the same as the unit of Z. Further, in the present specification, when a compound is expressed by a chemical formula in which a composition ratio of composition elements is not limited such as "TiN", it is assumed that the chemical formula includes all the conventionally known composition ratios (element ratios). In this case, it is assumed that the above-described chemical formula includes not only a stoichiometric composition but also a non-stoichiometric composition. For example, the chemical formula "TiN" includes not only a stoichiometric composition "$Ti_1N_1$" but also a non-stoichiometric composition such as "$Ti_1N_{0.8}$". The same also applies to compounds other than the "TiN".

<<Cutting Tool>>

A cutting tool includes a substrate and a hard layer provided on the substrate, wherein
the hard layer includes a first unit layer and a second unit layer,
one or a plurality of the first unit layers and one or a plurality of the second unit layers are alternately layered in the hard layer,
a thickness of each of the one or plurality of first unit layers is 2 nm or more and 100 nm or less,
a thickness of each of the one or plurality of second unit layers is 2 nm or more and 100 nm or less,
the first unit layer is composed of a compound represented by $Ti_aAl_bB_cN$,
the second unit layer is composed of a compound represented by $Ti_dAl_eB_fN$,
an atomic ratio a of a titanium element in the $Ti_aAl_bB_cN$ is 0.25 or more and less than 0.45,
an atomic ratio b of an aluminum element in the $Ti_aAl_bB_cN$ is 0.55 or more and less than 0.75,
an atomic ratio c of a boron element in the $Ti_aAl_bB_cN$ is more than 0 and 0.1 or less, a total of the atomic ratio a, the atomic ratio b, and the atomic ratio c is 1, an atomic ratio d of a titanium element in the $Ti_aAl_eB_fN$ is 0.35 or more and less than 0.55, an atomic ratio e of an aluminum element in the $Ti_aAl_eB_fN$ is 0.45 or more and less than 0.65, an atomic ratio f of a boron element in the $Ti_aAl_eB_fN$ is more than 0 and 0.1 or less, a total of the atomic ratio d, the atomic ratio e, and the atomic ratio f is 1, the atomic ratio a and the atomic ratio d satisfy $0.05 \leq d-a \leq 0.2$, and the atomic ratio b and the atomic ratio e satisfy $0.05 \leq b-e \leq 0.2$.

Examples of the cutting tool according to the present embodiment include a drill, an end mill, an indexable cutting insert for drill, an indexable cutting insert for end mill, an indexable cutting insert for milling, an indexable cutting insert for turning, a metal saw, a gear cutting tool, a reamer, a tap, and the like.

FIG. 1 is a perspective view illustrating one implementation of a cutting tool. The cutting tool having such a shape is used as an indexable cutting insert, for example. Cutting tool 10 has a rake face 1, a flank face 2, and a cutting edge ridgeline portion 3 at which rake face 1 and flank face 2 cross each other. That is, rake face 1 and flank face 2 are surfaces connected to each other with cutting edge ridgeline portion 3 being interposed therebetween. Cutting edge ridgeline portion 3 constitutes a cutting edge tip portion of cutting tool 10. It is also understandable that the shape of such a cutting tool 10 corresponds to a shape of the substrate of the cutting tool. That is, the substrate has the rake face, the flank face, and the cutting edge ridgeline portion that connects the rake face and the flank face to each other.

<Substrate>

For the substrate of the present embodiment, any conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material.

Among these various types of substrates, it is particularly preferable to select the cemented carbide (particularly, the WC-based cemented carbide) or to select the cermet (particularly, the TiCN-based cermet). This is due to the following reason: each of these substrates is excellent in balance between hardness and strength particularly at a high temperature, and has excellent characteristics as a substrate of a cutting tool for the above-described purpose of use.

When the cemented carbide is used as the substrate, the effects of the present embodiment are achieved even if the cemented carbide includes free carbon or an abnormal phase called η phase in the structure thereof. It should be noted that the substrate used in the present embodiment may have a modified surface. For example, in the case of the cemented carbide, a β-free layer may be formed at the surface. In the case of the cBN sintered material, a surface hardening layer may be formed at the surface. Even when the surface is thus modified, the effects of the present embodiment are exhibited.

When the cutting tool is an indexable cutting insert (such as an indexable cutting insert for turning, or an indexable cutting insert for milling), a substrate having a chip breaker or a substrate having no chip breaker may be included. For the shape of the ridgeline portion of the cutting edge, any of the following shapes is included: a sharp edge (ridge at which the rake face and the flank face cross each other); a honing (shape obtained by providing a curvature to the sharp edge); a negative land (chamfered shape); and a shape obtained by combining the honing and the negative land.

<Coating Film>

The coating film according to the present embodiment is provided on the substrate. The "coating film" has a function of improving various characteristics in the cutting tool such as heat resistance, breakage resistance, wear resistance, and the like by coating at least a portion (for example, a portion of the rake face) of the substrate. The coating film preferably coats the entire surface of the substrate. However, a coating film that does not coat a portion of the substrate and a coating film having a partially different configuration are not deviated from the scope of the present embodiment. The coating film includes a hard layer having first and second unit layers.

The thickness of the coating film is preferably 1 μm or more and 20 μm or less, is more preferably 1.5 μm or more and 12 μm or less, and is further preferably 2 μm or more and 8 μm or less. Here, the thickness of the coating film refers to a total of respective thicknesses of layers included in the coating film. Examples of the "layers included in the coating film" include the hard layer and below-described other layers such as an underlying layer, an intermediate layer, and a surface layer. The thickness of the coating film can be determined, for example, as follows: a transmission electron microscope (TEM) is used to measure thicknesses at ten arbitrary points in a cross sectional sample parallel to the normal direction of the surface of the substrate, and the average value of the measured thicknesses at the ten points is determined. A measurement magnification on this occasion is 10000×, for example. The cross sectional sample is, for example, a sample obtained by slicing the cross section of the cutting tool using an ion slicer apparatus. The same applies to the cases of measuring the thicknesses of the hard layer, the underlying layer, the intermediate layer, the surface layer, and the like. Examples of the transmission electron microscope include JEM-2100F (tradename) provided by JEOL.

(Hard Layer)

Figure 2:
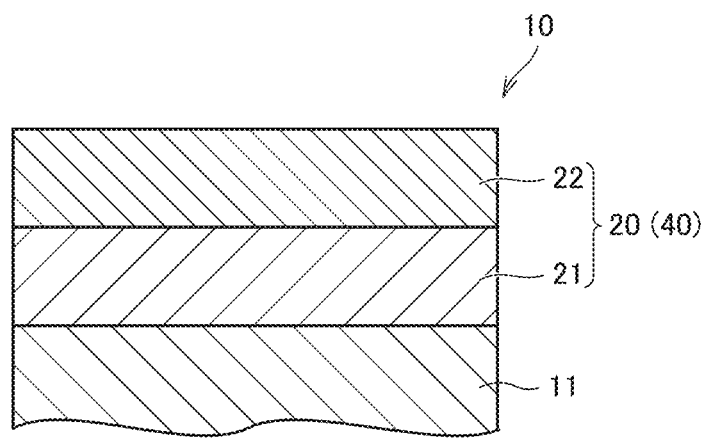
FIG. 2 is a schematic cross sectional view of a cutting tool according to one implementation of the present embodiment.
Figure 3:
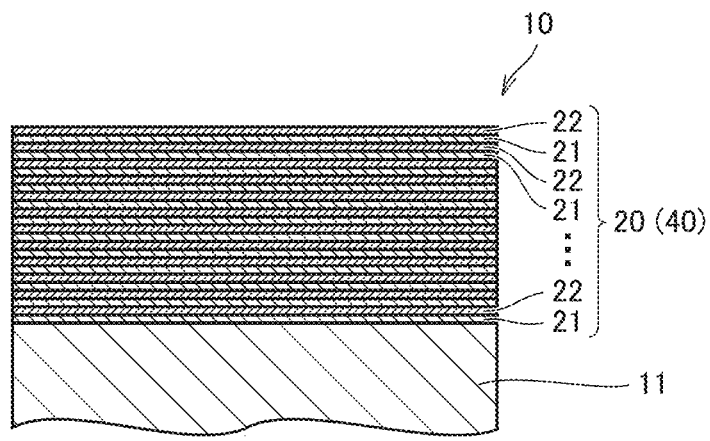
FIG. 3 is a schematic cross sectional view of a cutting tool according to another implementation of the present embodiment.
Figure 6:
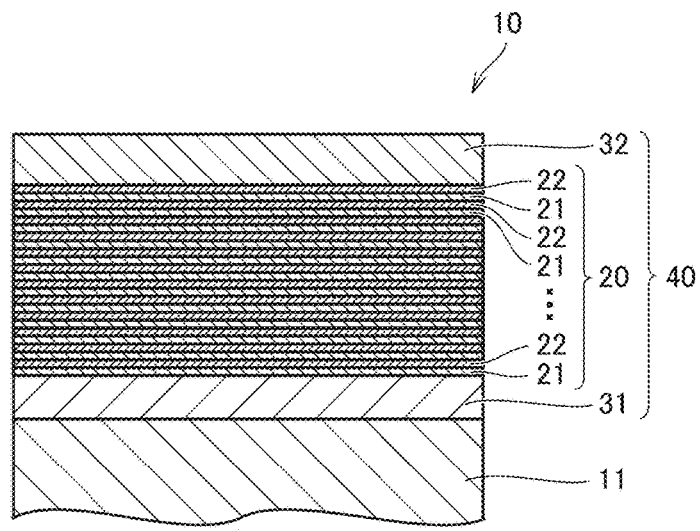
FIG. 6 is a schematic cross sectional view of a cutting tool according to still another implementation of the present embodiment.

Hard layer 20 according to the present embodiment includes a first unit layer 21 and a second unit layer 22 (FIG. 2). In hard layer 20, one or a plurality of first unit layers 21 and one or a plurality of second unit layers 22 are alternately layered (FIGS. 2, 3, and 6). The hard layer may start from first unit layer 21 or may start from the second unit layer. Hard layer 20 may be provided directly on substrate 11 as long as the effects of the cutting tool according to the present embodiment are maintained (FIGS. 2 and 3) or may be provided on substrate 11 with another layer such as underlying layer 31 being interposed therebetween (FIG. 6). Other layer(s) such as a surface layer 32 may be provided on hard layer 20 as long as the effects of the cutting tool are maintained (FIG. 6). Further, hard layer 20 may be provided at a surface of coating film 40.

In one aspect of the present embodiment, a plurality of the hard layers may be provided as long as the effects of the cutting tool are maintained. For example, when the coating film includes a first hard layer and a second hard layer, the coating film may further include an intermediate layer provided between the first hard layer and the second hard layer.

The hard layer preferably coats the flank face of the substrate. The hard layer preferably coats the rake face of the substrate. More preferably, the hard layer coats the entire surface of the substrate. However, a substrate having a portion not coated with the hard layer is not deviated from the scope of the present embodiment.

The thickness of the hard layer is preferably 1 μm or more and 20 μm or less, is more preferably 1.5 μm or more and 12 μm or less, and is further preferably 2 μm or more and 8 μm or less. Thus, the cutting tool can have excellent wear resistance. The thickness can be measured, for example, by observing the above-described cross section of the cutting tool using a transmission electron microscope at a magnification of 10000×.

(X-Ray Diffraction Analysis in Hard Layer)

Preferably, a ratio $I_{(200)}/I_{(002)}$ of an intensity $I_{(200)}$ of an X-ray diffraction peak of a (200) plane to an intensity $I_{(002)}$ of an X-ray diffraction peak of a (002) plane in the hard layer is 2 or more, and a half-value width of the X-ray diffraction peak of the (002) plane is 2° or more. Here, the "intensity $I_{(200)}$ of the X-ray diffraction peak of the (200) plane" refers to a diffraction intensity (peak height) at the highest peak of X-ray diffraction peaks originated from the (200) plane. The same applies to the "intensity $I_{(200)}$ of the X-ray diffraction peak of the (002) plane".

Figure 5:
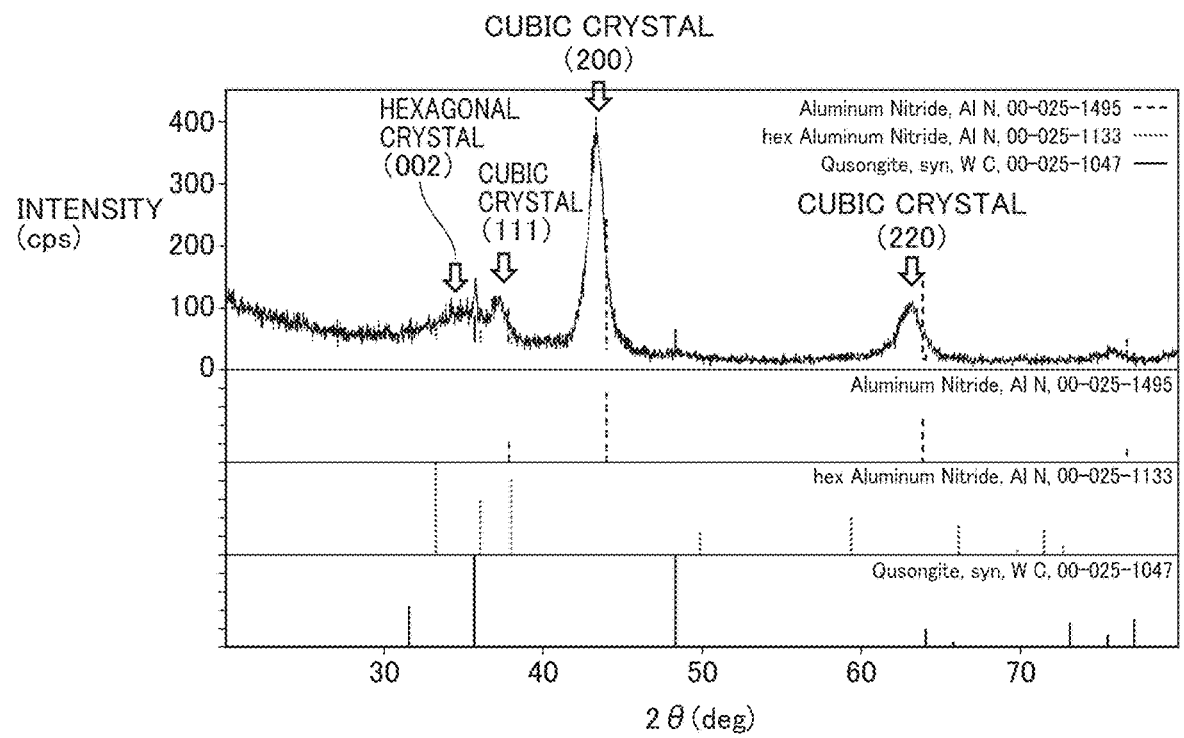
FIG. 5 is an exemplary spectrum diagram obtained when an X-ray diffraction analysis is performed onto the hard layer according to the present embodiment.

Specifically, X-ray diffraction measurement (XRD measurement) employing a θ/2θ method is performed onto each of three arbitrary points in the hard layer under conditions described in below-described examples so as to find an X-ray diffraction intensity of a predetermined crystal plane, and an average value of the found X-ray diffraction intensities at the three points is regarded as the X-ray diffraction intensity of the predetermined crystal plane. On this occasion, the X-ray diffraction intensity of the (200) plane corresponds to an X-ray diffraction intensity in the vicinity of 2θ=43 to 44°, and the X-ray diffraction intensity of the (002) plane corresponds to an X-ray diffraction intensity in the vicinity of 2θ=30 to 40° (for example, see FIG. 5). In FIG. 5, the vertical axis represents the X-ray diffraction intensity, and the horizontal axis represents the value of 2θ. Examples of an apparatus used for the X-ray diffraction measurement include: "SmartLab" (tradename) provided by Rigaku; "X'pert" (tradename) provided by PANalytical; and the like.

Figure 4:
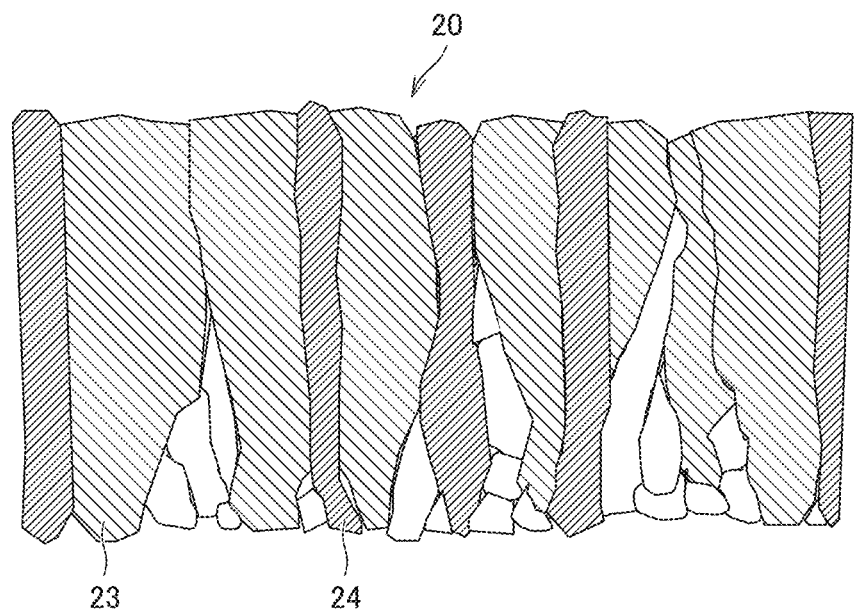
FIG. 4 is a schematic cross sectional view illustrating a crystal structure of a hard layer according to the present embodiment.

The X-ray diffraction intensity of the (200) plane is originated from cubic crystals in the hard layer. The intensity $I_{(200)}$ of the X-ray diffraction peak of the (002) plane is originated from hexagonal crystals in the hard layer. Therefore, presence or absence of the cubic crystals or the hexagonal crystals in the hard layer can be determined in accordance with the presence or absence of these peaks. Further, ratio $I_{(200)}/I_{(002)}$ of 2 or more means that a mixed crystal of cubic columnar crystals 23 and hexagonal columnar crystals 24 is formed in the hard layer (FIG. 4). In each of cubic columnar crystals 23 and hexagonal columnar crystals 24, the first and second unit layers are alternately layered; however, the layered structure is not illustrated in FIG. 4 for the sake of convenience.

The upper limit of ratio $I_{(200)}/I_{(002)}$ may be, for example, 10 or less, may be less than 10, or may be 5 or less.

The upper limit of the half-value width of the X-ray diffraction peak of the (002) plane may be 4° or less, or may be 3° or less.

(Mechanical Characteristics in Hard Layer)

In the present embodiment, a hardness H of the hard layer at a room temperature is preferably 30 GPa or more, is more preferably 30 GPa or more and 50 GPa or less, and is further preferably 35 GPa or more and 45 GPa or less.

In the present embodiment, a Young's modulus E of the hard layer at the room temperature is preferably 700 GPa or less, is more preferably 400 GPa or more and 700 GPa or less, and is further preferably 400 GPa or more and 550 GPa or less.

A ratio H/E of hardness H of the hard layer to Young's modulus E of the hard layer at the room temperature is preferably 0.07 or more, is more preferably 0.07 or more and 0.12 or less, and is further preferably 0.08 or more and 0.11 or less.

Hardness H and Young's modulus E can be determined by a nano-indentation method according to a standard procedure defined in "ISO 14577-1: 2015 Metallic materials—Instrumented indentation test for hardness and materials parameters—". In the present embodiment, the "room temperature" means 25° C. In order to precisely determine hardness H and Young's modulus E, an indentation depth of an indenter is set so as not to exceed 1/10 of the thickness of the hard layer in an indentation direction of the indenter. A pressing load of the indenter is set to 1 g. As a sample, the above-described cross section sample may be used as long as the cross sectional area of the hard layer can be secured to be 10 times as large as the area of the indenter. Alternatively, in order to secure a sufficiently wide cross sectional area of the hard layer with respect to the indenter, a sample having a cross section inclined with respect to the normal direction of the surface of the substrate may be used. Such measurement is performed onto at least ten cross section samples, and respective average values of hardnesses H and Young's moduli E determined for the samples are defined as hardness H and Young's modulus E of the hard layer. It should be noted that data considered to apparently indicate an abnormal value is excluded. Examples of an apparatus that performs the above-described nano-indentation method include ENT-1100a provided by Elionix.

(First Unit Layer)

The thickness of the first unit layer is 2 nm or more and 100 nm or less, is preferably 2 nm or more and 50 nm or less, and is more preferably 2 nm or more and 10 nm or less. Each of the thickness of the first unit layer and the thickness of the second unit layer described later is found through an analysis employing electron energy loss spectroscopy (EELS). Specifically, first, in a scanning transmission electron microscope image (STEM image) of the above-described cross sectional sample, an intensity profile corresponding to Al is measured along a direction parallel to a layering direction of the hard layer. On this occasion, the intensity profile is represented as a line graph in which the X axis (horizontal axis) represents a distance from a start point of the measurement on the hard layer and the Y axis (vertical axis) represents an intensity (brightness originated from atoms). Next, in the obtained graph, a distance is found between a point indicating a local maximum value and a point indicating the next local maximum value in the line graph corresponding to Al. The found distance means a total thickness of the thicknesses of the first and second unit layers. The total thickness is calculated at each of at least four positions in this manner, an average value thereof is obtained, and a value obtained by dividing the obtained average value by 2 is used as the thickness of each of the first and second unit layers.

The first unit layer is composed of a compound represented by $Ti_aAl_bB_cN$. Here, the expression "composed of a compound represented by $Ti_aAl_bB_cN$" represents a concept including: an implementation in which the first unit layer is composed only of the compound represented by $Ti_aAl_bB_cN$; and an implementation in which the first unit layer is composed of the compound represented by $Ti_aAl_bB_cN$ and an inevitable impurity. Examples of the inevitable impurity include carbon (C) and oxygen (O). The composition of the first unit layer can be found by performing an elemental analysis onto a whole of the first unit layer in the above-described cross sectional sample by energy dispersive X-ray spectroscopy (TEM-EDX) accompanied with a TEM. An observation magnification on this occasion is, for example, 20000×.

An atomic ratio a of a titanium element in the $Ti_aAl_bB_cN$ is 0.25 or more and less than 0.45, is preferably 0.25 or more and 0.40 or less, and is more preferably 0.25 or more and 0.35 or less. Since atomic ratio a is in the above range, the first unit layer has an appropriate degree of hardness.

An atomic ratio b of an aluminum element in the $Ti_aAl_bB_cN$ is 0.55 or more and less than 0.75, is preferably 0.60 or more and less than 0.75, and is more preferably 0.65 or more and less than 0.75. Since atomic ratio b is in the above range, the first unit layer has excellent heat resistance.

An atomic ratio c of a boron element in the $Ti_aAl_bB_cN$ is more than 0 and 0.1 or less, is preferably 0.01 or more and 0.09 or less, and is more preferably 0.02 or more and 0.08 or less. Since atomic ratio c is in the above range, the first unit layer has an appropriate degree of hardness. It should be noted that a total of atomic ratio a, atomic ratio b, and atomic ratio c is 1.

(Second Unit Layer)

The thickness of the second unit layer is 2 nm or more and 100 nm or less, is preferably 2 nm or more and 50 nm or less, and is more preferably 2 nm or more and 10 nm or less.

The second unit layer is composed of a compound represented by $Ti_aAl_eB_fN$. Here, the expression "composed of a compound represented by $Ti_aAl_eB_fN$" represents a concept including: an implementation in which the second unit layer is composed only of the compound represented by $Ti_aAl_eB_fN$; and an implementation in which the second unit layer is composed of the compound represented by $Ti_aAl_eB_fN$ and an inevitable impurity. Examples of the inevitable impurity include carbon (C) and oxygen (O). The composition of the second unit layer can be found by performing an elemental analysis onto a whole of the second unit layer of the above-described cross sectional sample by energy dispersive X-ray spectroscopy (TEM-EDX) accompanied with a TEM. An observation magnification on this occasion is, for example, 20000×.

An atomic ratio d of a titanium element in the $Ti_aAl_eB_fN$ is 0.35 or more and less than 0.55, is preferably 0.35 or more and 0.50 or less, and is more preferably 0.35 or more and 0.45 or less. Since atomic ratio d is in the above range, the first unit layer has an appropriate degree of hardness.

An atomic ratio e of an aluminum element in the $Ti_aAl_eB_fN$ is 0.45 or more and less than 0.65, is preferably 0.50 or more and less than 0.65, and is more preferably 0.55 or more and less than 0.65. Since atomic ratio e is in the above range, the first unit layer has an appropriate degree of hardness.

An atomic ratio f of a boron element in the $Ti_aAl_eB_fN$ is more than 0 and 0.1 or less, is preferably 0.01 or more and 0.09 or less, and is more preferably 0.02 or more and 0.08 or less. Since atomic ratio f is in the above range, the first unit layer has an appropriate degree of hardness. It should be noted that a total of atomic ratio d, atomic ratio e, and atomic ratio f is 1.

In the present embodiment, atomic ratio a and atomic ratio d satisfy $0.05 \leq d-a \leq 0.2$ and preferably satisfy $0.1 \leq d-a \leq 0.2$. Since d−a is in the above range, the cutting tool has excellent breakage resistance.

In the present embodiment, atomic ratio b and atomic ratio e satisfy $0.05 \leq b-e \leq 0.2$ and preferably satisfy $0.1 \leq b-e \leq 0.2$. Since b−e is in the above range, the cutting tool has excellent breakage resistance.

(Other Layer(s))

As long as the effects of the present embodiment are not compromised, the coating film may further include other layer(s). Examples of the other layer(s) include: the underlying layer provided between the substrate and the hard layer; the surface layer provided on the hard layer; and the like. Another example of the other layer(s) is an intermediate layer provided between a first hard layer and a second hard layer when the coating film includes the first hard layer and the second hard layer.

The underlying layer may be, for example, a layer composed of a compound represented by AlCrN. The surface layer may be, for example, a layer composed of a compound represented by TiN. The intermediate layer may be, for example, a layer composed of a compound represented by TiAlN. The composition of each of the other layer(s) can be found by performing an elemental analysis onto a whole of each of the other layer(s) in the above-described cross sectional sample by energy dispersive X-ray spectroscopy (TEM-EDX) accompanied with a TEM. An observation magnification on this occasion is, for example, 20000×.

The thickness of each of the other layer(s) is not particularly limited as long as the effects of the present embodiment are not compromised, and is, for example, 0.1 μm or more and 2 μm or less. The thickness can be measured, for example, by observing the above-described cross section of the cutting tool using a transmission electron microscope at a magnification of 10000×.

<<Method of Manufacturing Cutting Tool>>

A method of manufacturing the cutting tool according to the present embodiment includes:

a step (hereinafter, also referred to as "first step") of preparing the substrate; and a step (hereinafter, also referred to as "second step") of forming the hard layer by alternately layering one or a plurality of the first unit layers and one or a plurality of the second unit layers on the substrate using a physical vapor deposition method.

The physical vapor deposition method is a vapor deposition method in which a source material (also referred to as "evaporation source" or "target") is evaporated using a physical action and the evaporated source material is adhered onto the substrate or the like. Examples of the physical vapor deposition method include a sputtering method, an arc ion plating method, and the like. Particularly, the arc ion plating method is preferably used for the physical vapor deposition method used in the present embodiment.

In the arc ion plating method, the substrate is placed in an apparatus and the target is placed as a cathode, and high current is then applied to this target to cause arc discharge. Accordingly, the target is evaporated to ionize the atoms thereof to deposit them on the substrate fed with negative bias voltage, thereby forming the coating film.

<First Step: Step of Preparing Substrate>

In the first step, the substrate is prepared. For example, a cemented carbide substrate or a cubic boron nitride sintered material is prepared as the substrate. For each of the cemented carbide substrate and the cubic boron nitride sintered material, a commercially available substrate may be used, or each of the cemented carbide substrate and the cubic boron nitride sintered material may be produced by a general powder metallurgy method. For example, in the case of producing a cemented carbide by a general powder metallurgy method, first, a powder mixture is obtained by mixing a WC powder and a Co powder or the like using a ball mill or the like. The powder mixture is dried and is then shaped into a predetermined shape, thereby obtaining a shaped body. Further, the shaped body is sintered to obtain a WC—Co-based cemented carbide (sintered material). Next, the sintered material is subjected to a predetermined cutting edge process such as a honing process, thereby manufacturing a substrate composed of the WC—Co-based cemented carbide. In the first step, any substrate other than the one described above can be prepared as long as the substrate is conventionally known as this type of substrate.

<Second Step: Step of Forming Hard Layer>

In the second step, the one or plurality of first unit layers and the one or plurality of second unit layers are alternately layered on the substrate using the physical vapor deposition method, thereby forming the hard layer. As a method therefor, various methods are used depending on the composition of the hard layer to be formed. Examples of the method include: a method of using an alloy target with different particle sizes of titanium (Ti), aluminum (Al), boron (B) and the like; a method of using a plurality of targets having different compositions; a method of applying pulse voltage as bias voltage during film formation; a method of changing a gas flow rate during film formation; a method of adjusting a rotation speed of a substrate holder that holds the substrate in a film forming apparatus; or the like.

For example, the second step can be performed as follows. First, a chip having any shape is placed as the substrate in a chamber of the film forming apparatus. For example, the substrate may be attached to an outer surface of the substrate holder on a rotation table that is rotatably provided at the center of the chamber of the film forming apparatus. Next, the evaporation source for forming the first unit layer and the evaporation source for forming the second unit layer are placed to face each other so as to sandwich the substrate holder therebetween. A bias power supply is attached to the substrate holder. An arc power supply is attached to each of the evaporation source for forming the first unit layer and the evaporation source for forming the second unit layer. Nitrogen gas or the like is introduced as a reaction gas while rotating the substrate at the center of the chamber. Further, an arc current of 80 to 200 A is alternately supplied to the evaporation source for forming the first unit layer and the evaporation source for forming the second unit layer while gradually changing a voltage of the bias power supply in a range of 30 to 200 V (DC power supply) with the substrate being maintained at a temperature of 400 to 800° C. and reaction gas pressure being maintained at 1 to 10 Pa (partial pressure of the nitrogen gas is 5 to 10 Pa). Thus, metal ions are generated from the evaporation source for forming the first unit layer and the evaporation source for forming the second unit layer, with the result that the first unit layer is formed when the substrate faces the evaporation source for forming the first unit layer, and the second unit layer is formed when the substrate faces the evaporation source for forming the second unit layer. Further, by performing the film formation while changing the voltage of the bias power supply in the manner described above, high hardness of the hard layer and cutting edge quality can be both achieved.

When a predetermined time has elapsed, the supply of the arc current is stopped, thereby forming the hard layer (the first and second unit layers) on the surface of the substrate. On this occasion, the thickness of each of the first and second unit layers is adjusted by adjusting the rotation speed of the substrate. Further, by adjusting the film formation time, the thickness of the hard layer is adjusted to fall within a predetermined range. In the second step, the hard layer may be formed not only on a portion to be involved in a cutting process (for example, the rake face in the vicinity of the cutting edge) but also on a surface of the substrate other than the portion to be involved in the cutting process.

Conventionally, it has been known that cubic crystals are dominant in a layer (TiAlN layer) composed of a compound represented by TiAlN and such a layer has excellent hardness. On the other hand, it has been known that when boron is added as a source material at the time of forming the TiAlN layer, hexagonal crystals are likely to be formed to result in decreased hardness. Therefore, normally, it has not been considered to use boron as a source material in addition to titanium and aluminum when forming the TiAlN layer. The present inventors have not been dictated by such common knowledge, have added a small amount of boron as a source material in addition to titanium and aluminum to form a hard layer having a multilayer structure including first and second unit layers, and have found, contrary to expectations, for the first time that a cutting tool having excellent heat resistance and excellent breakage resistance is accordingly obtained.

Preferably, in one aspect of the present embodiment, an arc current of 80 to 120 A is alternately supplied to the evaporation source for forming the first unit layer and the evaporation source for forming the second unit layer while gradually changing the voltage of the bias power supply in the range of 30 to 200 V (DC power supply) with the substrate being maintained at a temperature of 500 to 600° C. and the reaction gas pressure being maintained at 5 to 10 Pa (the partial pressure of nitrogen gas is 5 to 8 Pa). Thus, a mixed crystal structure of the cubic crystals and the hexagonal crystals can be formed in the hard layer. With such a mixed crystal structure, the cubic columnar crystals and the hexagonal columnar crystals are suppressed from being coarse, thus resulting in improved toughness and heat resistance of the hard layer.

(Source Material for First Unit Layer)

In the second step, the source material for the first unit layer includes titanium, aluminum, and boron, such as titanium boride, metallic aluminum, and titanium aluminum boride. A blending composition of the source material for the first unit layer can be appropriately adjusted in accordance with an intended composition of the first unit layer. The source material for the first unit layer may be in the form of a powder or may be in the form of a flat plate.

(Source Material for Second Unit Layer)

In the second step, the source material for the second unit layer includes titanium, aluminum, and boron, such as metallic titanium, aluminum boride, and titanium aluminum boride. A blending composition of the source material for the second unit layer can be appropriately adjusted in accordance with an intended composition of the second unit layer. The blending composition of the source material for the second unit layer is preferably different from the blending composition of the source material for the first unit layer. The source material for the second unit layer may be in the form of a powder or may be in the form of a flat plate.

In the present embodiment, the above-described reaction gas is appropriately set in accordance with the composition of the hard layer. Examples of the reaction gas include: a mixed gas of nitrogen gas and argon gas; nitrogen gas; and the like.

<Other Step(s)>

In the manufacturing method according to the present embodiment, in addition to the above-described steps, the following step(s) may be appropriately performed between the first step and the second step: a step of performing an ion bombardment process onto a surface of the substrate; a step of forming an underlying layer between the substrate and the hard layer; a step of forming a surface layer on the hard layer; a step of forming an intermediate layer between the first hard layer and the second hard layer; a step of performing surface treatment; and the like.

When the above-described other layer(s) such as the underlying layer, the intermediate layer, and the surface layer are formed, the other layer(s) may be formed by a conventional method.

EXAMPLES

While the present invention will be described below in detail with reference to examples, the present invention is not limited thereto.

<<Production of Cutting Tool>>

<Preparation of Substrate>

First, as a substrate on which a coating film is to be formed, each of an indexable cutting insert P (cemented carbide corresponding to JIS standard P30; SEMT13T3AGSN) for turning and an indexable cutting insert K (cemented carbide corresponding to JIS standard K30; SEMT13T3AGSN) for turning was prepared (first step).

<Ion Bombardment Process>

Prior to producing the coating film as described below, an ion bombardment process was performed onto a surface of the substrate in the following procedure. First, the substrate was set in an arc ion plating apparatus. Next, the ion bombardment process was performed under the following conditions.

Gas composition: Ar (100%)
Gas pressure: 0.5 Pa
Bias voltage: 600 V (DC power supply)
Process time: 60 minutes <Production of Coating Film>

The coating film was produced by forming a hard layer (with a multilayer structure or a single layer) shown in Tables 2-1 to 2-3 on a surface of the substrate having been through the ion bombardment process. Hereinafter, a method of producing the hard layer will be described.

(Production of Hard Layer)

In each of samples 1 to 22, samples 102 to 104, and samples 106 to 109, nitrogen gas was introduced as reaction gas in a state in which the substrate (indexable cutting insert P for turning and indexable cutting insert K for turning) was rotated at the center of a chamber. Further, an arc current of 90 A was alternately supplied to an evaporation source for forming a first unit layer and an evaporation source for forming a second unit layer while gradually changing the voltage of the bias power supply in a range of 35 to 180 V with the substrate being maintained at a temperature of 550° C. and reaction gas pressure being maintained at 8 Pa (partial pressure of nitrogen gas: 8 Pa). Thus, metal ions were generated from the evaporation source for forming the first unit layer and the evaporation source for forming the second unit layer, and the supply of the arc current was stopped when a predetermined time has elapsed, thereby forming a hard layer having a composition shown in Tables 2-1 to 2-3 on the surface of the substrate (second step). Here, the evaporation source for forming the first unit layer and the evaporation source for forming the second unit layer have source material compositions shown in Table 1-1 and Table 1-2. On this occasion, the hard layer was produced to have a thickness shown in Tables 2-1 to 2-3 by alternately layering the first and second unit layers having the compositions shown in Tables 2-1 to 2-3 one by one while adjusting the rotation speed of the substrate. The composition of the hard layer in Tables 2-1 to 2-3 was found by performing an elemental analysis onto a whole of the hard layer in the cross sectional sample by energy dispersive X-ray spectroscopy (TEM-EDX) accompanied with a TEM as described above. An observation magnification on this occasion was 20000×.

In each of samples 101 and 105, the film formation was performed using only the evaporation source for forming the first unit layer (Tables 1-2 and 2-3). Therefore, the hard layer in each of samples 101 and 105 has a single layer rather than a multilayer structure.

By the above steps, cutting tools of samples 1 to 22 and samples 101 to 109 were produced.

TABLE 1-1

| Sample | Composition of Source Material for Forming First Unit Layer | | | Composition of Source Material for Forming Second Unit Layer | | |
| --- | --- | --- | --- | --- | --- | --- |
| | Ti | Al | B | Ti | Al | B |
| 1 | 0.26 | 0.67 | 0.07 | 0.30 | 0.60 | 0.10 |
| 2 | 0.24 | 0.73 | 0.03 | 0.40 | 0.55 | 0.05 |
| 3 | 0.40 | 0.55 | 0.05 | 0.50 | 0.45 | 0.05 |
| 4 | 0.30 | 0.60 | 0.10 | 0.40 | 0.50 | 0.10 |
| 5 | 0.25 | 0.70 | 0.05 | 0.30 | 0.60 | 0.10 |
| 6 | 0.26 | 0.67 | 0.07 | 0.50 | 0.45 | 0.05 |
| 7 | 0.30 | 0.60 | 0.10 | 0.40 | 0.50 | 0.10 |
| 8 | 0.26 | 0.67 | 0.07 | 0.40 | 0.55 | 0.05 |
| 9 | 0.30 | 0.60 | 0.10 | 0.40 | 0.50 | 0.10 |
| 10 | 0.26 | 0.67 | 0.07 | 0.45 | 0.50 | 0.05 |
| 11 | 0.25 | 0.70 | 0.05 | 0.40 | 0.55 | 0.05 |
| 12 | 0.40 | 0.55 | 0.05 | 0.45 | 0.50 | 0.05 |
| 13 | 0.30 | 0.60 | 0.10 | 0.26 | 0.67 | 0.07 |
| 14 | 0.26 | 0.67 | 0.07 | 0.40 | 0.50 | 0.10 |
| 15 | 0.25 | 0.70 | 0.05 | 0.40 | 0.55 | 0.05 |
| 16 | 0.26 | 0.67 | 0.07 | 0.40 | 0.55 | 0.05 |
| 17 | 0.25 | 0.70 | 0.05 | 0.40 | 0.55 | 0.05 |
| 18 | 0.30 | 0.60 | 0.10 | 0.40 | 0.55 | 0.05 |
| 19 | 0.40 | 0.55 | 0.05 | 0.45 | 0.50 | 0.05 |
| 20 | 0.40 | 0.55 | 0.05 | 0.45 | 0.50 | 0.05 |
| 21 | 0.30 | 0.60 | 0.10 | 0.40 | 0.50 | 0.10 |
| 22 | 0.40 | 0.55 | 0.05 | 0.45 | 0.50 | 0.05 |

TABLE 1-2

| Sample | Composition of Source Material for Forming First Unit Layer | | | Composition of Source Material for Forming Second Unit Layer | | |
| --- | --- | --- | --- | --- | --- | --- |
| | Ti | Al | B | Ti | Al | B |
| 101 | 0.26 | 0.67 | 0.07 | — | — | — |
| 102 | 0.15 | 0.75 | 0.10 | 0.25 | 0.60 | 0.15 |
| 103 | 0.40 | 0.55 | 0.05 | 0.30 | 0.60 | 0.10 |
| 104 | 0.26 | 0.67 | 0.07 | 0.25 | 0.65 | 0.07 |
| 105 | 0.35 | 0.65 | 0 | — | — | — |
| 106 | 0.30 | 0.70 | 0 | 0.35 | 0.65 | 0 |
| 107 | 0.25 | 0.60 | 0.15 | 0.35 | 0.50 | 0.15 |
| 108 | 0.26 | 0.67 | 0.07 | 0.30 | 0.60 | 0.10 |
| 109 | 0.26 | 0.67 | 0.07 | 0.30 | 0.60 | 0.10 |

TABLE 2-1

| | Hard Layer | | | | | | | | | | |
|---|---|---|---|---|---|---|---|---|---|---|---|
| | First Unit Layer ($Ti_aAl_bB_cN$) | | | | Second Unit Layer ($Ti_dAl_eB_fN$) | | | | | | Thickness |
| | Compositions of Metallic Components | | | Thickness* | Compositions of Metallic Components | | | Thickness* | | | of Hard Layer |
| Sample | Ti (a) | Al (b) | B (c) | (nm) | Ti (d) | Al (e) | B (f) | (nm) | d-a | b-e | Layer Structure | (μm) |
| 1 | 0.30 | 0.65 | 0.05 | 10.0 | 0.38 | 0.57 | 0.05 | 10.0 | 0.08 | 0.08 | Multilayer Structure | 5.0 |
| 2 | 0.25 | 0.74 | 0.01 | 4.0 | 0.40 | 0.59 | 0.01 | 4.0 | 0.15 | 0.15 | Multilayer Structure | 13.0 |
| 3 | 0.43 | 0.56 | 0.01 | 11.0 | 0.50 | 0.49 | 0.01 | 11.0 | 0.07 | 0.07 | Multilayer Structure | 8.0 |
| 4 | 0.35 | 0.56 | 0.09 | 97.0 | 0.44 | 0.47 | 0.09 | 97.0 | 0.09 | 0.09 | Multilayer Structure | 18.0 |
| 5 | 0.28 | 0.68 | 0.04 | 21.0 | 0.35 | 0.62 | 0.03 | 21.0 | 0.07 | 0.06 | Multilayer Structure | 9.0 |
| 6 | 0.34 | 0.62 | 0.04 | 17.0 | 0.51 | 0.45 | 0.04 | 17.0 | 0.17 | 0.17 | Multilayer Structure | 15.0 |
| 7 | 0.32 | 0.61 | 0.07 | 13.0 | 0.38 | 0.53 | 0.09 | 13.0 | 0.06 | 0.08 | Multilayer Structure | 3.0 |
| 8 | 0.31 | 0.64 | 0.05 | 11.0 | 0.42 | 0.53 | 0.05 | 11.0 | 0.11 | 0.11 | Multilayer Structure | 0.8 |
| 9 | 0.27 | 0.65 | 0.08 | 7.0 | 0.38 | 0.54 | 0.08 | 7.0 | 0.11 | 0.11 | Multilayer Structure | 21.0 |
| 10 | 0.33 | 0.63 | 0.04 | 22.0 | 0.47 | 0.49 | 0.04 | 22.0 | 0.14 | 0.14 | Multilayer Structure | 10.0 |

*represents a thickness of one layer.

TABLE 2-2

| | Hard Layer | | | | | | | | | | |
|---|---|---|---|---|---|---|---|---|---|---|---|
| | First Unit Layer ($Ti_aAl_bB_cN$) | | | | Second Unit Layer ($Ti_dAl_eB_fN$) | | | | | | Thickness |
| | Compositions of Metallic Components | | | Thickness* | Compositions of Metallic Components | | | Thickness* | | | of Hard Layer |
| Sample | Ti (a) | Al (b) | B (c) | (nm) | Ti (d) | Al (e) | B (f) | (nm) | d-a | b-e | Layer Structure | (μm) |
| 11 | 0.31 | 0.67 | 0.02 | 29.0 | 0.37 | 0.61 | 0.02 | 29.0 | 0.06 | 0.06 | Multilayer Structure | 22.0 |
| 12 | 0.38 | 0.59 | 0.03 | 38.0 | 0.44 | 0.53 | 0.03 | 38.0 | 0.06 | 0.06 | Multilayer Structure | 6.0 |
| 13 | 0.34 | 0.61 | 0.05 | 17.0 | 0.41 | 0.54 | 0.05 | 17.0 | 0.07 | 0.07 | Multilayer Structure | 16.0 |
| 14 | 0.27 | 0.68 | 0.05 | 13.0 | 0.37 | 0.58 | 0.05 | 13.0 | 0.10 | 0.10 | Multilayer Structure | 7.0 |
| 15 | 0.28 | 0.69 | 0.03 | 11.0 | 0.42 | 0.55 | 0.03 | 11.0 | 0.14 | 0.14 | Multilayer Structure | 12.0 |
| 16 | 0.33 | 0.62 | 0.05 | 8.0 | 0.44 | 0.51 | 0.05 | 8.0 | 0.11 | 0.11 | Multilayer Structure | 0.9 |
| 17 | 0.35 | 0.62 | 0.03 | 9.0 | 0.41 | 0.56 | 0.03 | 9.0 | 0.06 | 0.06 | Multilayer Structure | 5.0 |
| 18 | 0.36 | 0.59 | 0.05 | 19.0 | 0.46 | 0.49 | 0.05 | 19.0 | 0.10 | 0.10 | Multilayer Structure | 21.0 |
| 19 | 0.38 | 0.59 | 0.03 | 21.0 | 0.47 | 0.50 | 0.03 | 21.0 | 0.09 | 0.09 | Multilayer Structure | 9.0 |
| 20 | 0.39 | 0.57 | 0.04 | 9.0 | 0.47 | 0.49 | 0.04 | 9.0 | 0.08 | 0.08 | Multilayer Structure | 0.8 |
| 21 | 0.33 | 0.59 | 0.08 | 10.0 | 0.41 | 0.51 | 0.08 | 10.0 | 0.08 | 0.08 | Multilayer Structure | 0.8 |
| 22 | 0.38 | 0.59 | 0.03 | 30.0 | 0.47 | 0.50 | 0.03 | 30.0 | 0.09 | 0.09 | Multilayer Structure | 0.8 |

*represents a thickness of one layer.

TABLE 2-3

| | Hard Layer | | | | | | | | | | |
|---|---|---|---|---|---|---|---|---|---|---|---|
| | First Unit Layer ($Ti_aAl_bB_cN$) | | | | Second Unit Layer ($Ti_dAl_eB_fN$) | | | | | | | Thickness of |
| | Compositions of Metallic Components | | | Thickness* | Compositions of Metallic Components | | | Thickness* | | | Layer | Hard Layer |
| Sample | Ti (a) | Al (b) | B (c) | (nm) | Ti (d) | Al (e) | B (f) | (nm) | d-a | b-e | Structure | (μm) |
| 101 | 0.30 | 0.65 | 0.05 | — | — | — | — | — | — | — | Single Layer | 6.0 |
| 102 | 0.18 | 0.76 | 0.06 | 15.0 | 0.37 | 0.57 | 0.06 | 15.0 | 0.19 | 0.19 | Multilayer Structure | 9.0 |
| 103 | 0.46 | 0.51 | 0.03 | 16.0 | 0.36 | 0.61 | 0.03 | 16.0 | −0.1 | −0.1 | Multilayer Structure | 6.0 |
| 104 | 0.29 | 0.65 | 0.06 | 26.0 | 0.28 | 0.66 | 0.06 | 26.0 | −0.01 | −0.01 | Multilayer Structure | 7.0 |
| 105 | 0.38 | 0.62 | — | — | — | — | — | — | — | — | Single Layer | 8.0 |
| 106 | 0.35 | 0.65 | — | 14.0 | 0.34 | 0.66 | — | 14.0 | −0.01 | −0.01 | Multilayer Structure | 7.0 |
| 107 | 0.28 | 0.59 | 0.13 | 11.0 | 0.37 | 0.50 | 0.13 | 11.0 | 0.09 | 0.09 | Multilayer Structure | 12.0 |
| 108 | 0.31 | 0.64 | 0.05 | 1.8 | 0.38 | 0.57 | 0.05 | 1.8 | 0.07 | 0.07 | Multilayer Structure | 5.0 |
| 109 | 0.33 | 0.62 | 0.05 | 104.0 | 0.39 | 0.56 | 0.05 | 104.0 | 0.06 | 0.06 | Multilayer Structure | 5.0 |

*represents a thickness of one layer.

<<Evaluations on Characteristics of Cutting Tool>>

Each of the cutting tools of samples 1 to 22 and samples 101 to 109 produced as described above was used to evaluate characteristics of the cutting tool as follows. It should be noted that each of the cutting tools of samples 1 to 22 corresponds to an example of the present disclosure, and each of the cutting tools of samples 101 to 109 corresponds to a comparative example.

<Measurement of Thickness of Coating Film (Thickness of Hard Layer)>

The thickness of the coating film (i.e., the thickness of the hard layer) was found by performing measurement at arbitrary 10 points in the cross sectional sample parallel to the normal direction of the surface of the substrate using a transmission electron microscope (TEM) (tradename: JEM-2100F provided by JEOL) and calculating an average value of the measured thicknesses at the 10 points. Results are shown in Tables 2-1 and 2-2.

Further, when each of the coating films of samples 1 to 22, samples 102 to 104, and samples 106 to 109 was observed by a STEM, it was found that the hard layer forms a multilayer structure in which the first and second unit layers were alternately layered.

<Measurement of Thicknesses of First and Second Unit Layers>

Each of the thicknesses of the first and second unit layers was found by an analysis employing EELS. Specifically, in a STEM image obtained by the above measurement, an intensity profile corresponding to Al was measured along a direction parallel to the layering direction of the hard layer. The intensity profile was represented as a line graph in which the X axis (horizontal axis) represents a distance from a start point of the measurement on the hard layer and the Y axis (vertical axis) represents an intensity (brightness originated from atoms). In the obtained graph, a distance was found between a point indicating a local maximum value and a point indicating a next local maximum value in the line graph corresponding to Al. The found distance means a total thickness of the thicknesses of the first and second unit layers. The total thickness was calculated at each of at least four positions in this manner, an average value thereof was found, and a value obtained by dividing the found average value by 2 was used as the thickness of each of the first and second unit layers. Results are shown in Tables 2-1 and 2-2.

<X-Ray Diffraction Analysis on Hard Layer>

An analysis was performed onto the hard layer in accordance with an X-ray diffraction analysis method (XDR analysis method) to find respective X-ray diffraction intensities $I_{(200)}$ and $I_{(200)}$ of a (200) plane and a (002) plane. Conditions for the X-ray diffraction analysis are described below. $I_{(200)}/I_{(002)}$ and a peak half-value width of $I_{(200)}$ as found are shown in Tables 3-1 and 3-2.

Conditions for X-ray diffraction analysis
Scanning axis: 2θ-θ
X-ray source: Cu-Kα ray (1.541862 Å)
Detector: zero-dimension detector (scintillation counter)
Tube voltage: 45 kV
Tube current: 40 mA
Incident-light optical system: Use of Mirror
Light-receiving optical system: use of analyzer crystal (PW3098/27)
Step: 0.03°
Integration time: 2 seconds
Scanning range (2θ): 200 to 80°

Further, presence or absence of cubic crystals and hexagonal crystals in the hard layer was determined based on a result of the X-ray diffraction analysis. Results are shown in Tables 3-1 and 3-2.

<Analysis on Mechanical Characteristics of Hard Layer (Analysis on Hardness and Young's Modulus)>

Hardness H and Young's modulus E of the hard layer in each cutting tool were measured by a nano-indentation method according to a standard procedure defined in "ISO 14577-1: 2015 Metallic materials—Instrumented indentation test for hardness and materials parameters—". Here, an indentation depth of an indenter was set to 100 nm. A pressing load of the indenter was set to 1 g. A measurement temperature was set to a room temperature (25° C.). Further, as each sample, a cross section sample was used which had been mirror-finished to secure a cross sectional area of the hard layer that is 10 times as large as the area of the indenter. As a measurement apparatus, ENT-1100a (tradename) provided by Elionix was used. The above measurement was performed onto ten cross section samples, and respective average values of the hardnesses and Young's moduli determined for the samples were defined as hardness H and Young's modulus E of the hard layer. It should be noted that data considered to apparently indicate an abnormal value was excluded. Moreover, a ratio H/E of hardness H to Young's modulus E was also calculated. Results are shown in Tables 3-1 and 3-2.

TABLE 3-1

| | Crystal Structure of Hard Layer | | Peak Half-Value Width of $I_{(002)}$ | Mechanical Characteristics of Hard Layer | | |
|---|---|---|---|---|---|---|
| Sample | Main Phase | $I_{(200)}/I_{(002)}$ | | Hardness H (GPa) | Young's Modulus E (GPa) | H/E |
| 1 | Cubic + Hexagonal | 2.6 | 2.2 | 41.4 | 418.2 | 0.099 |
| 2 | Cubic + Hexagonal | 5.5 | 3.4 | 34.9 | 453.2 | 0.077 |
| 3 | Cubic + Hexagonal | 5.1 | 2.6 | 32.2 | 423.7 | 0.076 |
| 4 | Cubic + Hexagonal | 4.1 | 2.5 | 37.2 | 418.0 | 0.089 |
| 5 | Cubic + Hexagonal | 3.8 | 2.4 | 41.9 | 544.2 | 0.077 |
| 6 | Cubic + Hexagonal | 4.1 | 2.5 | 36.5 | 429.4 | 0.085 |
| 7 | Cubic + Hexagonal | 4.8 | 3.0 | 33.3 | 462.5 | 0.072 |
| 8 | Cubic + Hexagonal | 2.8 | 2.1 | 35.1 | 444.3 | 0.079 |
| 9 | Cubic + Hexagonal | 5.1 | 3.5 | 34.1 | 437.2 | 0.078 |
| 10 | Cubic + Hexagonal | 6.9 | 4.1 | 42.2 | 639.4 | 0.066 |
| 11 | Cubic + Hexagonal | 3.1 | 2.4 | 37.1 | 553.7 | 0.067 |
| 12 | Cubic + Hexagonal | 5.7 | 2.7 | 28.2 | 454.8 | 0.062 |
| 13 | Cubic + Hexagonal | 1.8 | 2.1 | 32.2 | 441.1 | 0.073 |
| 14 | Cubic + Hexagonal | 11.1 | 2.2 | 31.9 | 443.1 | 0.072 |
| 15 | Cubic + Hexagonal | 4.6 | 1.8 | 30.4 | 410.8 | 0.074 |
| 16 | Cubic + Hexagonal | 8.2 | 1.6 | 33.6 | 448.0 | 0.075 |
| 17 | Cubic + Hexagonal | 3.5 | 1.9 | 32.9 | 506.2 | 0.065 |
| 18 | Cubic + Hexagonal | 6.3 | 3.0 | 29.2 | 442.4 | 0.066 |
| 19 | Cubic + Hexagonal | 12.9 | 1.5 | 28.2 | 454.8 | 0.062 |
| 20 | Cubic + Hexagonal | 11.8 | 1.6 | 28.5 | 425.4 | 0.067 |
| 21 | Cubic | — | — | 27.2 | 469.0 | 0.058 |
| 22 | Hexagonal | — | — | 28.9 | 466.1 | 0.062 |

TABLE 3-2

| | Crystal Structure of Hard Layer | | | Mechanical Characteristics of Hard Layer | | |
|---|---|---|---|---|---|---|
| Sample | Main Phase | $I_{(200)}/I_{(002)}$ | Peak Half-Value Width of $I_{(002)}$ | Hardness H (GPa) | Young's Modulus E (GPa) | H/E |
| 101 | Cubic + Hexagonal | 3.6 | 2.2 | 37.1 | 458.0 | 0.081 |
| 102 | Hexagonal | — | — | 24.2 | 410.2 | 0.059 |
| 103 | Cubic | — | — | 34.2 | 502.9 | 0.068 |
| 104 | Hexagonal | — | — | 25.1 | 398.4 | 0.063 |
| 105 | Cubic | — | — | 30.2 | 616.3 | 0.049 |
| 106 | Hexagonal | — | — | 25.1 | 398.4 | 0.063 |

TABLE 3-2-continued

| | | Crystal Structure of Hard Layer | | Mechanical Characteristics of Hard Layer | | |
|---|---|---|---|---|---|---|
| Sample | Main Phase | $I_{(200)}/I_{(002)}$ | Peak Half-Value Width of $I_{(002)}$ | Hardness H (GPa) | Young's Modulus E (GPa) | H/E |
| 107 | Hexagonal | — | — | 22.2 | 312.7 | 0.071 |
| 108 | Cubic + Hexagonal | 2.9 | 2.3 | 37.1 | 458.0 | 0.081 |
| 109 | Cubic + Hexagonal | 4.5 | 3.0 | 37.1 | 458.0 | 0.081 |

<<Cutting Test>>
  <Cutting Evaluation (1)>
  Cutting (cutting distance: 900 mm) was performed under below-described cutting conditions using each of the obtained cutting tools (indexable cutting insert P for turning). Then, whether or not breakage had occurred at the cutting edge of the cutting tool was observed using an optical microscope. The same cutting test was performed ten times to calculate a breakage ratio (%) of the cutting edge. In the cutting under the below-described cutting conditions, it is considered that a load resulting from impact is repeatedly applied to the cutting edge of the cutting tool. Therefore, a cutting tool with a low breakage ratio can be evaluated to have excellent breakage resistance. Results are shown in Tables 4-1 and 4-2.
(Cutting Conditions)
  Workpiece: S50C (holes of Φ8 exist at intervals with a center distance of 18 mm)
  Cutting speed: 160 m/min.
  Feed amount: 0.65 mm/t
  Depth of cut (axis direction): 2.5 mm
  Depth of cut (radial direction): 100% of the tool diameter
  Dry
<<Cutting Test>>
  <Cutting Evaluation (2)>
  Cutting was performed under below-described cutting conditions using each of the obtained cutting tools (indexable cutting insert K for turning) to measure a cutting distance until the width of breakage of the flank face in the vicinity of a cutting boundary of the cutting edge became 0.5 mm. Results are shown in Tables 4-1 and 4-2. In Tables 4-1 and 4-2, it is indicated that as the cutting distance is longer, the breakage resistance is more excellent.
(Cutting Conditions)
  Workpiece: Inconel 718 (shape: quadrangle)
  Cutting speed: 30 m/min.
  Feed amount: 0.35 mm/t
  Depth of cut (axis direction): 2 mm
  Depth of cut (radial direction): 70% of the tool diameter
  Wet

TABLE 4-1

| Sample | Cutting Evaluation (1) Breakage Ratio (%) | Cutting Evaluation (2) Cutting Distance (mm) |
|---|---|---|
| 1 | 0 | 3100 |
| 2 | 0 | 2900 |
| 3 | 0 | 2700 |
| 4 | 0 | 2900 |
| 5 | 0 | 3000 |
| 6 | 0 | 2900 |
| 7 | 0 | 2700 |
| 8 | 10 | 2600 |

TABLE 4-1-continued

| Sample | Cutting Evaluation (1) Breakage Ratio (%) | Cutting Evaluation (2) Cutting Distance (mm) |
|---|---|---|
| 9 | 10 | 2700 |
| 10 | 20 | 2600 |
| 11 | 30 | 2400 |
| 12 | 30 | 2400 |
| 13 | 20 | 2200 |
| 14 | 30 | 2300 |
| 15 | 30 | 2300 |
| 16 | 50 | 2000 |
| 17 | 40 | 2100 |
| 18 | 60 | 1900 |
| 19 | 60 | 1900 |
| 20 | 80 | 1600 |
| 21 | 70 | 1500 |
| 22 | 80 | 1500 |

TABLE 4-2

| Sample | Cutting Evaluation (1) Breakage Ratio (%) | Cutting Evaluation (2) Cutting Distance (mm) |
|---|---|---|
| 101 | 100 | 700 |
| 102 | 100 | 400 |
| 103 | 100 | 500 |
| 104 | 100 | 400 |
| 105 | 100 | 700 |
| 106 | 100 | 600 |
| 107 | 100 | 800 |
| 108 | 90 | 500 |
| 109 | 90 | 400 |

<Results>
  In view of the results of the cutting evaluation (1), each of the cutting tools of samples 1 to 22 had a breakage ratio of 80% or less, and attained excellent results. On the other hand, each of the cutting tools of samples 101 to 109 had a breakage ratio of 90% or more. In view of the above results, it was found that each of the cutting tools of samples 1 to 22 according to the examples of the present disclosure had excellent breakage resistance (Tables 4-1 and 4-2).
  In view of the results of the cutting evaluation (2), each of the cutting tools of samples 1 to 22 had a cutting distance of 1500 mm or more, and attained excellent results. On the other hand, each of the cutting tools of the samples 101 to 109 had a cutting distance of 800 mm or less. In view of the above results, it was found that each of the cutting tools of samples 1 to 22 according to the examples of the present disclosure had excellent breakage resistance (Tables 4-1 and 4-2).
  Although the embodiments and examples of the present invention have been described above, the configurations of the embodiments and examples described above may be appropriately combined.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: rake face; 2: flank face; 3: cutting edge ridgeline portion; 10: cutting tool; 11: substrate; 20: hard layer; 21: first unit layer; 22: second unit layer; 23: cubic columnar crystal; 24: hexagonal columnar crystal; 31: underlying layer; 32: surface layer; 40: coating film

The invention claimed is:

1. A cutting tool comprising a substrate and a hard layer provided on the substrate, wherein
   the hard layer includes a first unit layer and a second unit layer,
   one or a plurality of the first unit layers and one or a plurality of the second unit layers are alternately layered in the hard layer,
   a thickness of each of the one or plurality of first unit layers is 2 nm or more and 100 nm or less,
   a thickness of each of the one or plurality of second unit layers is 2 nm or more and 100 nm or less,
   the first unit layer is composed of a compound represented by $Ti_aAl_bB_cN$,
   the second unit layer is composed of a compound represented by $Ti_dAl_eB_fN$,
   an atomic ratio a of a titanium element in the $Ti_aAl_bB_cN$ is 0.25 or more and less than 0.45,
   an atomic ratio b of an aluminum element in the $Ti_aAl_bB_cN$ is 0.55 or more and less than 0.75,
   an atomic ratio c of a boron element in the $Ti_aAl_bB_cN$ is more than 0 and 0.1 or less,
   a total of the atomic ratio a, the atomic ratio b, and the atomic ratio c is 1,
   an atomic ratio d of a titanium element in the $Ti_dAl_eB_fN$ is 0.35 or more and less than 0.55,
   an atomic ratio e of an aluminum element in the $Ti_dAl_eB_fN$ is 0.45 or more and less than 0.65,
   an atomic ratio f of a boron element in the $Ti_dAl_eB_fN$ is more than 0 and 0.1 or less,
   a total of the atomic ratio d, the atomic ratio e, and the atomic ratio f is 1,
   the atomic ratio a and the atomic ratio d satisfy $0.05 \leq d-a \leq 0.2$, and
   the atomic ratio b and the atomic ratio e satisfy $0.05 \leq b-e \leq 0.2$,
   wherein a ratio $I_{(200)}/I_{(002)}$ of an intensity $I_{(200)}$ of an X-ray diffraction peak of a (200) plane to an intensity $I_{(002)}$ of an X-ray diffraction peak of a (002) plane in the hard layer is 2 or more and 10 or less,
   a half-value width of the X-ray diffraction peak of the (002) plane is 2° or more and 4° or less, and
   a single underlying layer of unitary composition is provided between and directly contacts the substrate and one of a lowermost first unit layer or a lowermost second unit layer of the hard layer, and a thickness of the single underlying layer is 0.1 μm or more and 2 μm or less.

2. The cutting tool according to claim 1, wherein a hardness H of the hard layer at a room temperature is 30 GPa or more.

3. The cutting tool according to claim 2, wherein a ratio H/E of the hardness H of the hard layer to a Young's modulus E of the hard layer at the room temperature is 0.07 or more.

4. The cutting tool according to claim 1, wherein a thickness of the hard layer is 1 μm or more and 20 μm or less.

5. The cutting tool according to claim 3, wherein a hardness H of the hard layer at a room temperature is 30 GPa or more and 50 GPa or less.

6. The cutting tool according to claim 1, wherein a Young's modulus E of the hard layer at a room temperature is 400 GPa or more and 700 GPa or less.

7. The cutting tool according to claim 3, wherein a ratio H/E of the hardness H of the hard layer to a Young's modulus E of the hard layer at the room temperature is 0.07 or more and 0.12 or less.

8. The cutting tool according to claim 1, wherein the atomic ratio a of a titanium element in the $Ti_aAl_bB_cN$ is 0.25 or more and 0.40 or less.

9. The cutting tool according to claim 1, wherein the atomic ratio b of an aluminum element in the $Ti_aAl_bB_cN$ is 0.60 or more and less than 0.75.

10. The cutting tool according to claim 1, wherein the atomic ratio c of a boron element in the $Ti_aAl_bB_cN$ is 0.01 or more and 0.09 or less.

11. The cutting tool according to claim 1, wherein the atomic ratio d of a titanium element in the $Ti_dAl_eB_fN$ is 0.35 or more and 0.50 or less.

12. The cutting tool according to claim 1, wherein the atomic ratio e of an aluminum element in the $Ti_dAl_eB_fN$ is 0.50 or more and less than 0.65.

13. The cutting tool according to claim 1, wherein the atomic ratio f of a boron element in the $Ti_dAl_eB_fN$ is 0.01 or more and 0.09 or less.

* * * * *